United States Patent
Nuzzo

(10) Patent No.: US 8,994,361 B2
(45) Date of Patent: Mar. 31, 2015

(54) FINGER VOLTAGE SENSOR

(71) Applicant: John Nuzzo, North Branford, CT (US)

(72) Inventor: John Nuzzo, North Branford, CT (US)

(*) Notice: Subject to any disclaimer, the term of this patent is extended or adjusted under 35 U.S.C. 154(b) by 246 days.

(21) Appl. No.: 13/673,173

(22) Filed: Nov. 9, 2012

(65) Prior Publication Data

US 2014/0132244 A1    May 15, 2014

(51) Int. Cl.
*G01R 19/00* (2006.01)
*G01R 19/155* (2006.01)
*G01R 29/08* (2006.01)

(52) U.S. Cl.
CPC .......... *G01R 19/155* (2013.01); *G01R 19/0092* (2013.01); *G01R 19/0084* (2013.01); *G01R 29/0857* (2013.01)
USPC ........ 324/76.11; 324/522; 324/713; 324/72.5

(58) Field of Classification Search
CPC ........... G01R 19/0084; G01R 19/0092; G01R 19/15; G01R 19/155; G01R 19/165; G01R 19/16538; G01R 19/16571; G01R 19/16576; G01R 19/1659; G01R 19/16595; G01R 19/2513; G01R 1/06788; G01R 1/07; G01N 27/9046; B66C 15/065; H02H 3/08; H02H 3/12; H02H 3/20; H02H 3/207; H02H 3/24; H02H 3/38
USPC ............ 324/76.11, 76.39, 72.5, 98, 348, 522, 324/713; 340/660, 661, 662, 663, 664; 361/18, 79, 86, 87, 88, 90, 91.1; 702/38, 64
See application file for complete search history.

(56) References Cited

U.S. PATENT DOCUMENTS

| | | | | |
|---|---|---|---|---|
| 8,786,447 | B1* | 7/2014 | Wise | 340/573.4 |
| 2008/0024265 | A1* | 1/2008 | Jones | 338/252 |
| 2010/0220054 | A1* | 9/2010 | Noda et al. | 345/156 |

* cited by examiner

*Primary Examiner* — Hoai-an D Nguyen

(57) ABSTRACT

The present invention is a finger voltage sensor that includes a base finger ring worn by a user that works near an electrical source, an electricity sensor disposed on the base finger ring, the electricity sensor detects one or more electrical fields associated with the electrical source and a warning light disposed on the base finger ring, the warning light emits a constant light when the electricity sensor is activated and is in communication with the electricity sensor. The finger voltage sensor can also include a beeper instead of a warning light and a base finger ring that includes a hook and loop fastener that is releasably attached to a user's finger.

10 Claims, 2 Drawing Sheets

FINGER VOLTAGE SENSOR

TECHNICAL FIELD & BACKGROUND

Accidents and incidents involving electricity often occur because safe operating procedures are not applied. Currently there are limited alternatives to electrical safety features that can prevent individuals from being electrocuted.

The present invention generally relates to a voltage tester. More specifically, the invention is a finger voltage sensor.

It is an object of the invention to provide a finger voltage sensor that provides a relatively greater degree of safety and security for electrical workers.

It is an object of the invention to provide a finger voltage sensor that is worn on an electrical worker's finger that indicates when electricity is near the electrical worker.

What is really needed is a finger voltage sensor that provides a relatively greater degree of safety and security for electrical workers that is worn on an electrical worker's finger that indicates when electricity is near the electrical worker.

BRIEF DESCRIPTION OF THE DRAWINGS

The present invention will be described by way of exemplary embodiments, but not limitations, illustrated in the accompanying drawings in which like references denote similar elements, and in which.

DETAILED DESCRIPTION OF ILLUSTRATIVE EMBODIMENTS

Various aspects of the illustrative embodiments will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative embodiments. However, it will be apparent to one skilled in the art that the present invention may be practiced without the specific details. In other instances, well-known features are omitted or simplified in order not to obscure the illustrative embodiments.

Various operations will be described as multiple discrete operations, in turn, in a manner that is most helpful in understanding the present invention. However, the order of description should not be construed as to imply that these operations are necessarily order dependent. In particular, these operations need not be performed in the order of presentation.

The phrase "in one embodiment" is utilized repeatedly. The phrase generally does not refer to the same embodiment, however, it may. The terms "comprising", "having" and "including" are synonymous, unless the context dictates otherwise.

Figure 1A:
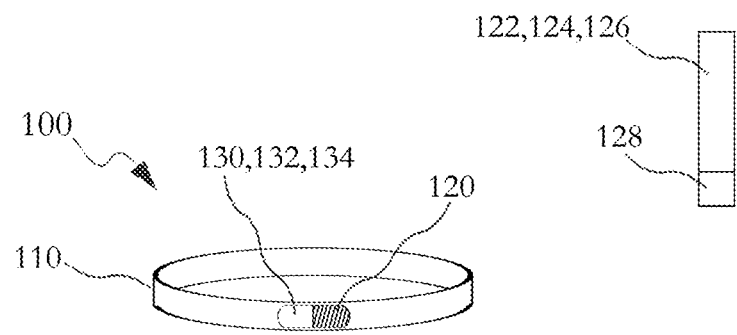
FIG. 1A illustrates a front view of a finger voltage sensor, according to an embodiment of the present invention.

FIG. 1A illustrates a front view of a finger voltage sensor 100, according to an embodiment of the present invention.

The finger voltage sensor 100 includes a base finger ring 110, an electricity sensor 120 and a warning light 130. The base finger ring 110 is worn by a user who is typically an electrical worker who works near electricity but can be worn by any suitable user. The base finger ring 110 illustrated in FIG. 1A is made of elastic but can be made of any suitable material such as relatively hard plastic. The electricity sensor 120 is disposed on the base finger ring 110 and detects one or more electrical fields 122 associated with an electrical source 124 such as a high voltage wire 126 or other suitable electrical source. More specifically, the electricity sensor 120 detects one or more electrical fields 122 associated with the electrical source 124. The warning light 130 is disposed on the base finger ring 110 and emits light when the electricity sensor 120 is activated. The warning light 130 is in communication with the electricity sensor 120 with a microchip 128 or other suitable communication. The warning light 130 can also emit a plurality of blinks or a plurality of flashes when the electricity sensor 120 is activated. The warning light 130 can be a liquid crystal diode or LCD light 132, a light emitting diode or LED light 134 or other suitable type of warning light. The LCD light 132 and LED light 134 are both relatively more energy efficient than traditional warning lights. The warning light 130 is positioned adjacent to the electricity sensor 120 while disposed on the base finger ring 110.

The finger voltage sensor 100 can also be provided with a beeper 140 instead of a warning light 130. The beeper 140 is also disposed on the base finger ring 110 adjacent to the electricity sensor 120 and emits a beeping sound when activated. The beeping sound can be a constant beeping sound, an intermittent beeping sound or other suitable beeping sound. The beeper 140 is also in communication with the electricity sensor 120 with a microchip 128 or other suitable communication.

Figure 1B:
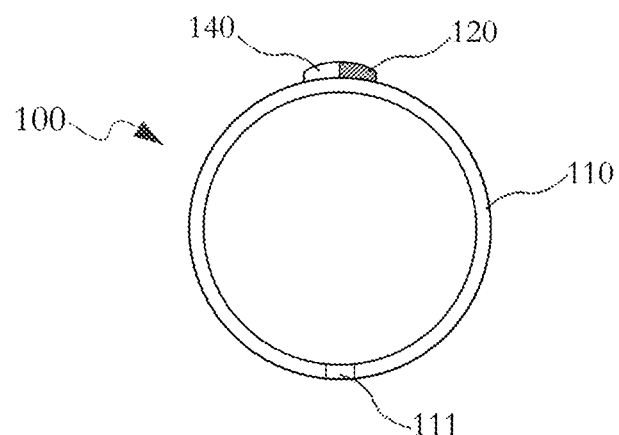
FIG. 1B illustrates an overhead view of a finger voltage sensor, according to an embodiment of the present invention.

FIG. 1B illustrates an overhead view of a finger voltage sensor 100, according to an embodiment of the present invention.

The finger voltage sensor 100 illustrated and described in FIG. 1B and its description includes an electricity sensor 120 and a warning light 130 or beeper 140 that is similar to the electricity sensor 120 and warning light 130 or beeper 140 that is illustrated and described in FIG. 1A and its description. In contrast to the finger voltage sensor 100 illustrated and described in FIG. 1A, the finger voltage sensor 100 illustrated and described in FIG. 1B includes a base finger ring 110 that is made of cloth or other suitable material with a hook and loop fastener 111 that can be releasably attached to a user's finger.

Figure 2:
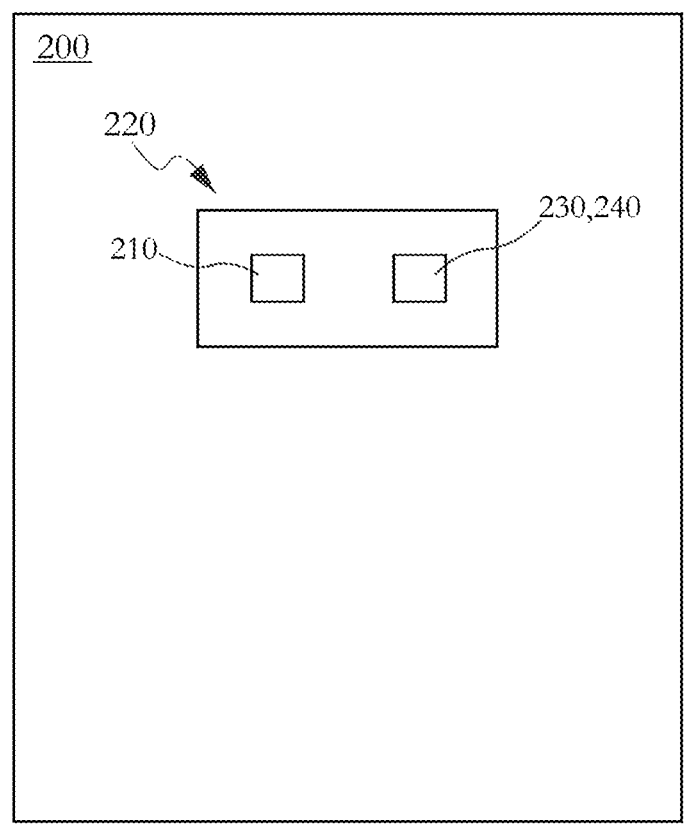
FIG. 2 illustrates an electrical diagram of a finger voltage sensor, according to an embodiment of the present invention.

FIG. 2 illustrates an electrical diagram of a finger voltage sensor 200, according to an embodiment of the present invention.

The finger voltage sensor 200 illustrated and described in FIG. 2 and its description includes an electricity sensor 210, a microchip 220 and a warning light 230 or beeper 240 that is similar to the electricity sensor 120, microchip 128 and warning light 130 or beeper 140 that is illustrated and described in FIG. 1A and its description.

The finger voltage sensor is a ring that is worn on a user's hand. Equipped with an electricity sensor, the finger voltage sensor is activated, when high voltage parts or wires are in proximity to the finger voltage sensor. The finger voltage sensor may illuminate or beep as a warning to a user to proceed with caution, while leaving the user's hands free to complete work. The finger voltage sensor may be readily available at safety or hardware supply retailers. The finger voltage sensor features an electrical sensor on a ring which can detect and alert an individual to the presence of one or more electrical fields. The finger voltage sensor is designed to be available on an elastic ring or a VELCRO® hook and loop fastener ring embodiment.

While the present invention has been related in terms of the foregoing embodiments, those skilled in the art will recognize that the invention is not limited to the embodiments described. The present invention can be practiced with modification and alteration within the spirit and scope of the appended claims. Thus, the description is to be regarded as illustrative instead of restrictive on the present invention.

The invention claimed is:

1. A finger voltage sensor for providing a sensory notification of the presence of an electrical source, comprising:
   a base finger ring wearable on the finger of a user;
   an electricity sensor disposed on the exterior surface of the base finger ring, wherein the electricity sensor is configured to activate when one or more electrical fields associated with the electrical source is detected; and
   at least one of a warning light and a beeper disposed on the exterior surface of the base finger ring, said warning light adapted to emit a light when the electricity sensor is activated and is in communication with the electricity and said beeper adapted to emit a sound when the electricity sensor is activated.

2. The finger voltage sensor according to claim 1, wherein the base finger ring includes a hook and loop fastener that enables it to be removably secured to the finger of a user.

3. The finger voltage sensor according to claim 1, wherein the base finger ring is made of a selected one of an elastic material and hard plastic.

4. The finger voltage sensor according to claim 1, wherein wherein the finger voltage sensor is provided with the warning light.

5. The finger voltage sensor according to claim 1, wherein the warning light is in communication with the electricity sensor with a microchip.

6. The finger voltage sensor according to claim 1, wherein the warning light emits a selected one of a plurality of blinks and a plurality of flashes when the electricity sensor is activated.

7. The finger voltage sensor according to claim 1, wherein the warning light is a selected one of a LCD light and a LED light.

8. The finger voltage sensor according to claim 1, wherein the at least one of the warning light and beeper is positioned adjacent to the electricity sensor on the exterior surface of the base finger ring.

9. The finger voltage sensor according to claim 1, wherein the finger voltage sensor is provided with a beeper.

10. The finger voltage sensor according to claim 1, wherein the beeper emits a selected one of a constant beeping sound and an intermittent beeping sound.

\* \* \* \* \*